United States Patent
Prasad et al.

(10) Patent No.: US 9,543,936 B1
(45) Date of Patent: Jan. 10, 2017

(54) RECONFIGURABLE VOLTAGE DESENSITIZATION CIRCUIT TO EMULATE SYSTEM CRITICAL PATHS

(71) Applicant: International Business Machines Corporation, Armonk, NY (US)

(72) Inventors: Mangal Prasad, Poughkeepsie, NY (US); Marshall D. Tiner, Elgin, TX (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/745,555

(22) Filed: Jun. 22, 2015

(51) Int. Cl.
H03K 5/135 (2006.01)
H03K 5/1534 (2006.01)
H03L 7/081 (2006.01)
H03K 5/00 (2006.01)

(52) U.S. Cl.
CPC ............ *H03K 5/135* (2013.01); *H03K 5/1534* (2013.01); *H03L 7/0814* (2013.01); *H03K 2005/00071* (2013.01)

(58) Field of Classification Search
CPC ........ H03F 3/245; H03F 3/195; H03F 1/0227; H03F 1/0261
See application file for complete search history.

(56) References Cited

U.S. PATENT DOCUMENTS

| 6,275,079 B1 * | 8/2001 | Park ...................... H03L 7/0891 327/143 |
| 7,015,732 B1 | 3/2006 | Holloway et al. |
| 7,576,569 B2 | 8/2009 | Carpenter et al. |
| 2006/0190744 A1 | 8/2006 | Blanco et al. |
| 2008/0104561 A1 | 5/2008 | Carpenter et al. |
| 2009/0031155 A1 | 1/2009 | Hofmann et al. |

(Continued)

FOREIGN PATENT DOCUMENTS

| DE | 19749553 A1 | 5/1999 |
| EP | 2672407 A1 | 12/2013 |
| WO | 2007053839 A3 | 5/2007 |

OTHER PUBLICATIONS

Prasad et al., "Reconfigurable Voltage Desensitization Circuit to Emulate System Critical Paths", U.S. Appl. No. 14/851,349, filed Sep. 11, 2015.

(Continued)

*Primary Examiner* — Sibin Chen
(74) *Attorney, Agent, or Firm* — L. Jeffrey Kelly

(57) ABSTRACT

A circuit for controlling a clock signal may include a voltage source that provides a bias voltage, and at least one delay element having a non-linear capacitive load coupled to an output of the delay element. The non-linear capacitive load receives the bias from the voltage source and controls a delay magnitude applied to a plurality of pulses of the clock signal by the delay element. Based on the bias having a first scaled voltage, the delay magnitude that is applied to the plurality of clock pulses is increased in order to generate a frequency correction to the operating frequency of a microprocessor based on a variation to a microprocessor supply voltage. Based on the bias having a second scaled voltage, the delay magnitude that is applied to the clock pulses is maintained to retain the operating frequency of the clock during the variation to the supply voltage.

9 Claims, 8 Drawing Sheets

(56) References Cited

U.S. PATENT DOCUMENTS

| | | | | |
|---|---|---|---|---|
| 2010/0264968 A1* | 10/2010 | Ko | ................... | H03K 5/133 327/158 |
| 2011/0267880 A1* | 11/2011 | Swei | ................... | G11O 5/148 365/175 |
| 2013/0311799 A1 | 11/2013 | Fitzpatrick et al. | | |
| 2014/0028374 A1 | 1/2014 | Zare-Hoseini et al. | | |
| 2015/0046721 A1 | 2/2015 | Drake et al. | | |

OTHER PUBLICATIONS

List of IBM Patents or Patent Applications Treated as Related, dated Sep. 10, 2015, pp. 1-2.

Carullo et al, "VSLI Based Analog Power System Emulator for Fast Contingency Analysis." In System Sciences, 2004. Proceedings of the 37th Annual Hawaii International Conference on System Sciences, IEEE, 2004, pp. 1-8.

Chang et al, "BEE2: A High-End Reconfigurable Computing System", 2005 IEEE Design and Test of Computers, pp. 114-125.

Tschanz et al., "Tunable Replica Circuits and Adaptive Voltage-Frequency Techniques for Dynamic Voltage, Temperature, and Aging Variation Tolerance", 2009 Symposium on VLSI Circuits Digest of Technical Papers, pp. 112-113.

\* cited by examiner

RECONFIGURABLE VOLTAGE DESENSITIZATION CIRCUIT TO EMULATE SYSTEM CRITICAL PATHS

BACKGROUND

The present invention generally relates to microprocessors, and more particularly to maintaining the performance of such microprocessors using control circuitry.

Microprocessor devices should operate reliably across a variety of environmental conditions. One occurrence associated with microprocessor environments is voltage droop, whereby as a result of, for example, changes in current load, the supply voltage momentarily drops. Voltage droop may in turn affect the maximum operating frequency ($f_{max}$) of the microprocessor compared to the actual frequency at which the microprocessor is being driven. For example, the microprocessor may be operating at a nominal clock frequency of 4.5 GHz, while the maximum operating frequency ($f_{max}$) of the microprocessor may be characterized as being 4.7 GHz. Thus, a guardband of 200 MHz (i.e., 4.7 GHz−4.5 GHz=0.2 GHz) exists.

According to one scenario, a voltage drop may cause the maximum operating frequency ($f_{max}$) of the microprocessor to reduce to 4.6 GHz while the microprocessor continues to operate at the nominal clock frequency of 4.5 GHz. Here, the microprocessor continues to operate within the provided guardband since the nominal frequency (i.e., 4.5 GHz) remains below the $f_{max}$ (i.e., 4.6 GHz) of the microprocessor. However, according to another scenario, the voltage drop may be significant enough to cause the maximum operating frequency ($f_{max}$) of the microprocessor to reduce to, for example, 4.3 GHz while the microprocessor continues to operate at the 4.5 GHz nominal frequency. Here, the microprocessor fails to operate within the provided guardband since the nominal frequency (i.e., 4.5 GHz) is now higher than the $f_{max}$ (i.e., 4.3 GHz) of the microprocessor. Therefore, as a result of driving the microprocessor at a nominal frequency (i.e., 4.5 GHz) that is beyond the momentarily reduced $f_{max}$ (i.e., 4.3 GHz) value, the microprocessor operation may fail.

BRIEF SUMMARY

According to one exemplary embodiment, a circuit for controlling a clock signal having an operating frequency that is generated by a clock source associated with a microprocessor device is provided. The circuit may include a voltage source that provides a bias voltage, and at least one delay element having a non-linear capacitive load coupled to an output of the at least one delay element, such that the non-linear capacitive load receives the bias voltage from the voltage source and controls a delay magnitude applied to a plurality of pulses corresponding to the clock signal by the at least one delay element. Based on the bias voltage having a first scaled voltage, the delay magnitude that is applied to the plurality of pulses of the clock signal is increased in order to generate a frequency correction to the operating frequency based on a variation to a supply voltage of the microprocessor. Based on the bias voltage having a second scaled voltage, the delay magnitude that is applied to the plurality of pulses of the clock signal is maintained in order to retain the operating frequency of the clock signal during the variation to the supply voltage of the microprocessor.

According to another exemplary embodiment, a method of controlling a clock signal having an operating frequency that is generated by a clock source associated with a microprocessor device is provided. The method may include applying the clock signal to an input of at least one delay element having a non-linear capacitive load coupled between an output of the at least one delay element and a ground reference, applying a first bias voltage to an input of the non-linear capacitive load and generating a first capacitance, applying a first delay to the received clock signal propagating through the at least one delay element based on the generated first capacitance and a first output resistance corresponding to the at least one delay element, decreasing the first bias voltage to the input of the non-linear capacitive load and generating a reduced first capacitance during a voltage droop occurring on a supply voltage of the microprocessor, increasing the first delay to the received clock signal propagating through the at least one delay element during the voltage droop based on the reduced first capacitance and an increase in the first output resistance, generating a frequency correction signal based on the increasing of the delay to the received clock signal, and applying the frequency correction signal to the clock source for reducing the operating frequency and maintaining a frequency guardband for the clock signal during the voltage droop.

According to yet another exemplary embodiment, a circuit for controlling a clock signal having an operating frequency that is generated by a clock source associated with a microprocessor device is provided. The circuit may include a voltage source that provides a bias voltage, and at least one inverter device having an input and an output. The input receives the clock signal generated by the clock source in the microprocessor device, while the at least one inverter device applies a delay to the received clock signal at the output. The circuit further includes at least one NFET transistor coupled to the output of the at least one inverter device, such that the at least one NFET transistor receives the bias voltage from the voltage source. The at least one NFET transistor includes a capacitance value that varies non-linearly as a function of the received bias voltage. Based on the NFET having a first capacitance value generated by a first bias voltage, the delay to the received clock signal is increased in order to generate a frequency correction to the operating frequency of the clock signal when a variation to a supply voltage of the microprocessor occurs. Based on the NFET having a second capacitance value generated by a second bias voltage, the delay to the received clock signal remains substantially unchanged in order to retain the operating frequency of clock signal when the variation to the supply voltage of the microprocessor occurs.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe emulation circuits that may be present within microprocessor devices. Particularly, the circuits emulate system critical paths across a range of microprocessor supply voltages (i.e., $V_{dd}$), whereby the system critical paths may be paths within the microprocessor design that limit frequency (i.e., the slowest path). The system critical paths may be emulated by one or more delay circuits that create different delay values in response to changes to microprocessor supply voltages (i.e., $V_{dd}$) undesirably caused by, for example, voltage droop. The changes in delay provide a means for sensing voltage droop and accordingly correcting the frequency value of the microprocessor's on-chip clock. This sensing and subsequent adjustment to the microprocessor's on-chip clock frequency maintains an adequate frequency guardband between the actual clock frequency and the maximum operating frequency ($f_{max}$) of the microprocessor. The following describes enhanced systems and methods for sensing and controlling microprocessor on-chip clock frequency based on $f_{max}$ limitations. It may be appreciated that, in some implementations, the following described embodiments can also sense and control an off-chip clock frequency associated with a microprocessor based on $f_{max}$ limitations.

Figure 1A:
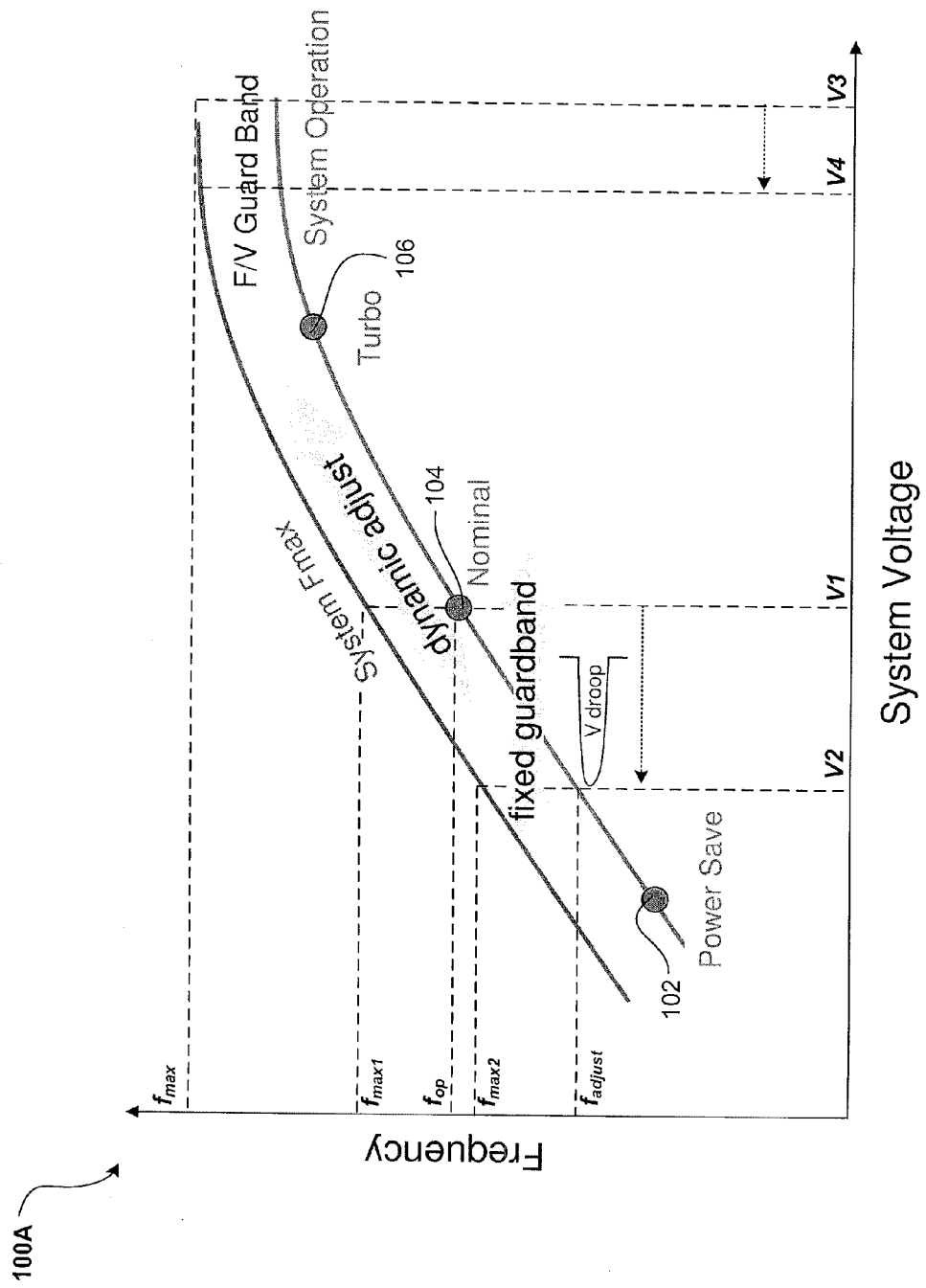
FIG. 1A is a graph showing changes in guardband frequency based on supply voltage variations, according to an exemplary embodiment.

Referring to FIG. 1A, graph 100A shows changes in guardband frequency based on supply voltage variations according to an exemplary embodiment. As depicted, at the supply voltage value of V1, the microprocessor clock may operate at nominal frequency value $f_{op}$, where the $f_{op}$ value has a predetermined lower frequency value than the corresponding $f_{max1}$ frequency at supply voltage V1. The frequency difference between $f_{max1}$ and $f_{op}$ at supply voltage V1 may provide the requisite frequency guardband. However, as a result of voltage droop or other conditions, the voltage supply may fall to V2, which in turn causes the $f_{max1}$ frequency to shift to a lower $f_{max2}$ frequency. As illustrated, if the microprocessor clock continues to operate at nominal frequency value $f_{op}$, since the $f_{op}$ frequency exceeds the $f_{max2}$ frequency, there is no longer a frequency guardband and the microprocessor operation may fail. However, in response to the voltage droop causing the supply voltage to reduce to V2, the nominal frequency value $f_{op}$ of the microprocessor clock may be dynamically adjusted (i.e., reduced) to frequency value $f_{adjust}$. Thus, the frequency guardband may be maintained and, therefore, the microprocessor clock is not operated at or above its operational tolerances given by $f_{max}$. By dynamically controlling the microprocessor clock frequency in response to, for example, voltage droop, the frequency guardband may be maintained across the various power supply ranges corresponding to power-save operation 102 (i.e., lower power supply values), nominal operation 104 (i.e., medium power supply values), and turbo operation 106 (i.e., higher power supply values).

Figure 1B:
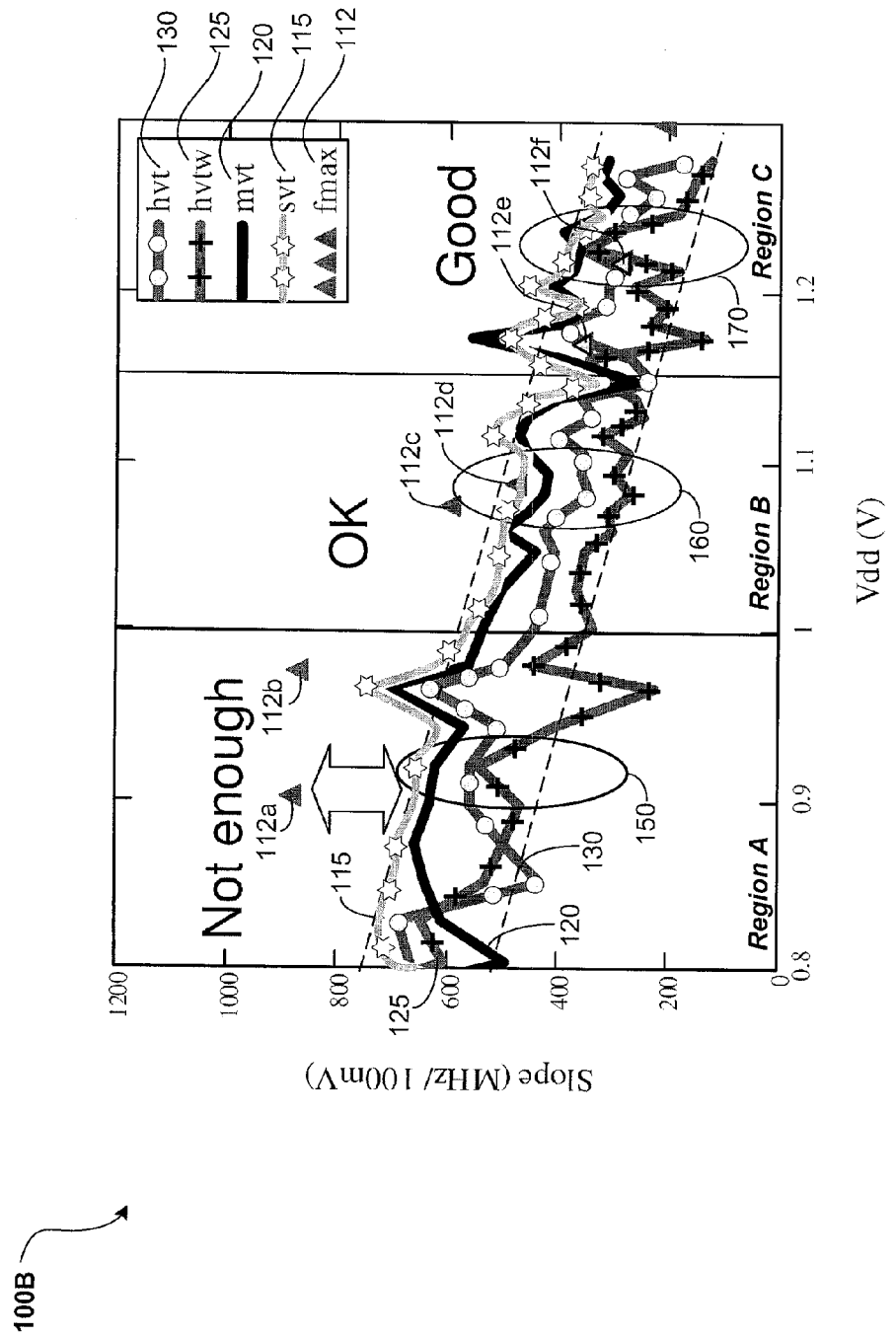
FIG. 1B is a graph depicting $f_{max}$ tracking abilities for different delay paths including a high voltage threshold (HVT) gate delay, a HVT gate and wire delay, a super-high voltage threshold (SVT) gate delay, and a medium voltage threshold (MVT) gate delay, according to one exemplary embodiment.

FIG. 1B is a graph depicting $f_{max}$ tracking abilities for different delay path embodiments including an HVT gate delay, an HVT gate and wire delay, an SVT gate delay, and an MVT gate delay. As indicated, the $f_{max}$ values 112a-112f corresponding to different microprocessor supply voltages are denoted by triangular symbols. Region A includes a range of lower supply voltage values of between about 0.8V-1.0V. Region B includes a range of medium supply voltage values of between about 1.0V-1.15V. Region C includes a range of higher supply voltage values corresponding to a range of about 1.15V-1.3V.

Curve 115 represents the rate of frequency change per voltage (i.e., tracking slope: MHz/100 mV) over the supply voltage range of the microprocessor for a delay path emulating super-high voltage threshold (SVT) transistor devices (e.g., $V_{th}$=0.4V). Curve 120 represents the rate of frequency change per voltage (i.e., tracking slope: MHz/100 mV) over the supply voltage range of the microprocessor for a delay path emulating medium voltage threshold (MVT) transistor devices (e.g., $V_{th}$=0.3V). Curve 125 represents the rate of frequency change per voltage (i.e., tracking slope MHz/100 mV) over the supply voltage range of the microprocessor for a delay path having high voltage threshold transistor devices with wire delay (HVTW). Also, curve 130 represents the rate of frequency change per voltage (i.e., tracking slope: MHz/100 mV) over the supply voltage range of the microprocessor for a delay path emulating high voltage threshold (HVT) transistor devices (e.g., $V_{th}$=0.2V).

Referring to Region A (0.8V-1.0V), the tracking slopes of curves 115, 120, 125, and 130, which correspond to delay paths SVT, MVT, HVTW, and HVT, respectively, do not track $f_{max}$ with much accuracy. As depicted, the slopes of these curves are insufficient to track the $f_{max}$ points. For example, referring to SVT curve 115, at a supply voltage of 0.9V, the SVT delay path has a tracking slope of approximately 700 MHz/100 mV, while a tracking slope of approximately 880 MHz/100 mV is required to track $f_{max}$ point 112a at this supply voltage (i.e., 0.9V). Thus, the $f_{max}$ values 112a, 112b are outside this grouping of curves, as indicated by 150.

Referring to Region B (1.0V-1.15V), the tracking slopes of curves 115, 120, 125, and 130, which correspond to delay paths SVT, MVT, HVTW, and HVT, respectively, to some extent track $f_{max}$ with reasonable accuracy. As depicted, the slopes of some of these curves are reasonably sufficient to track the $f_{max}$ points. For example, referring to SVT curve 115, at a supply voltage of about 1.08V, the SVT delay path has a tracking slope approximately equivalent to that of $f_{max}$ point 112d at this supply voltage (i.e., 1.08V). However, $f_{max}$ point 112c is outside this grouping of curves, as indicated by 160.

Referring to Region C (1.15V-1.3V), the tracking slopes of curves 115, 120, 125, and 130, which correspond to delay paths SVT, MVT, HVTW, and HVT, respectively, track $f_{max}$. As depicted, the slopes of theses curves are sufficient to track the $f_{max}$ points. For example, referring to HVT curve 130, at a supply voltage of about 1.17V, the HVT delay path has a tracking slope approximately equivalent to that of $f_{max}$ point 112e at this supply voltage (i.e., 1.17V). Moreover, at a supply voltage of about 1.22V, the HVTW delay path has a tracking slope approximately equivalent to that of $f_{max}$ point 112$f$ at this supply voltage (i.e., 1.22V). Thus, the $f_{max}$ values are within this grouping of curves, as indicated by 170.

Graph 100B indicates that over the turbo operating region (i.e., Region C) where the microprocessor operates at higher supply voltages (e.g., >1.0V), both a HVT delay path and a HVTW delay path provide the requisite tracking slopes for emulating $f_{max}$. However, accurate tracking of $f_{max}$ over the higher supply voltage range corresponding to the turbo operating regime may require the use of both the HVT delay path and the HVTW delay path. The following CPM circuit embodiment thus provides a single delay path for dynamically adjusting the tracking slope of the delay path over the higher supply voltage range of the turbo operating region utilized by the microprocessor. As described, enhanced tracking of $f_{max}$ may be accomplished by dynamically adjusting the tracking slope of the single CPM circuit in accordance with the embodiments described herein. As such, the CPM circuit takes up less real estate within the fabricated microprocessor chip. Further, the exemplary CPM circuit embodiment described herein introduces a voltage dependent non-linearity that provides an enhanced tracking (i.e., less tracking error) of the non-linear changes in $f_{max}$ as a function of supply voltage changes in the turbo operating region of the microprocessor.

Figure 2A:
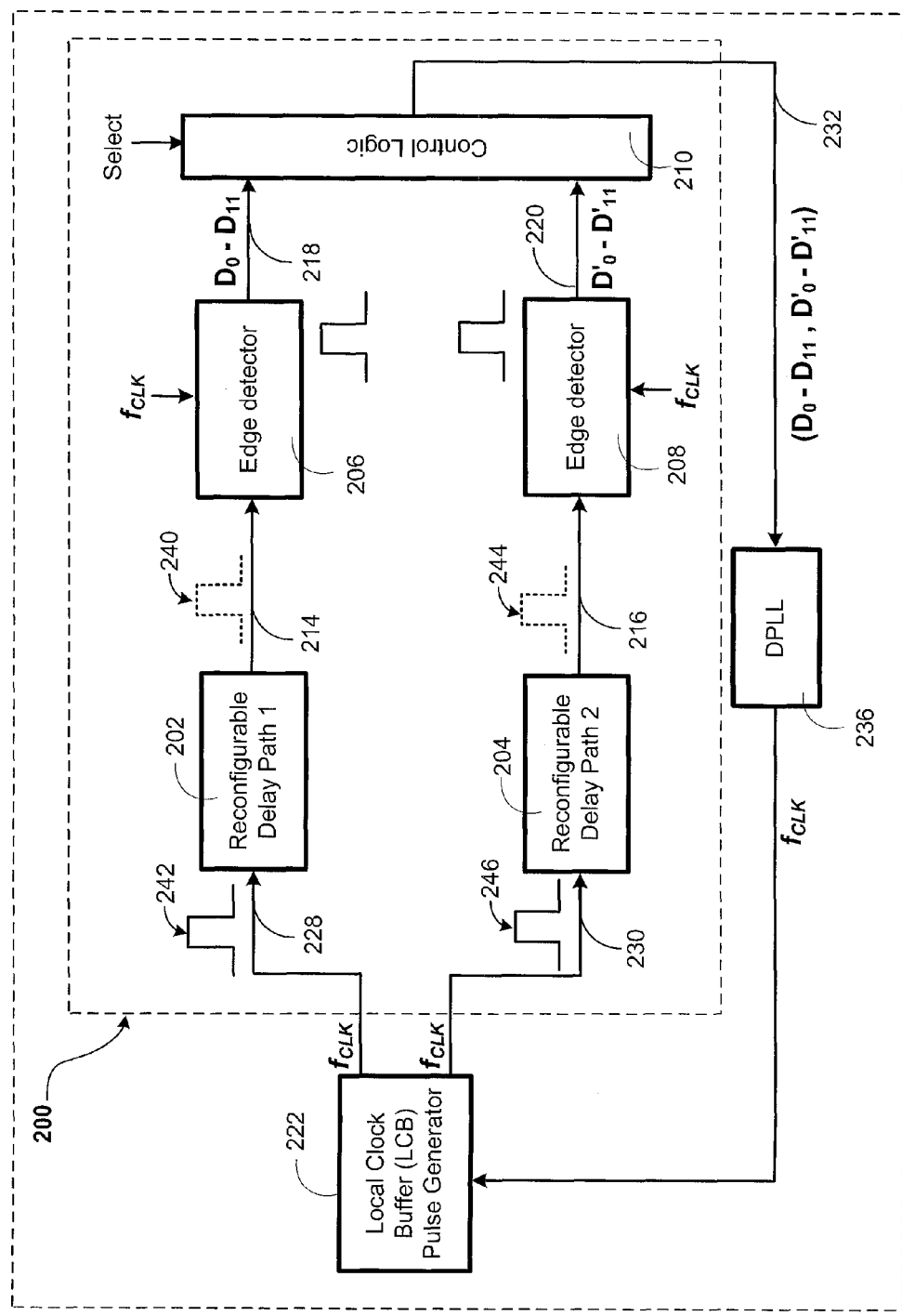
FIG. 2A is control circuit for monitoring and adjusting microprocessor clock frequency based on the $f_{max}$ behavior of the microprocessor according to one embodiment.

Referring to FIG. 2A, an exemplary control circuit 200 for monitoring and adjusting a microprocessor clock frequency of a clock source based on the $f_{max}$ behavior of the microprocessor according to one embodiment is depicted. The control circuit 200 may include a first reconfigurable delay path circuit 202 (i.e., a reconfigurable desensitization circuit), a second (optional) reconfigurable delay path circuit 204, a first edge detector circuit 206 coupled to output 214 of the first reconfigurable delay path circuit 202, a second edge detector circuit 208 coupled to the output 216 of the second reconfigurable delay path circuit 204, and control logic 210 that is coupled to outputs 218 and 220 of the first edge detector circuit 206 and the second edge detector circuit 208, respectively. It may be appreciated that any other control circuit (e.g., microprocessor-based control circuit) having reconfigurable delay path circuit 202 (i.e., a reconfigurable desensitization circuit) may be implemented in order to monitor and adjust microprocessor clock frequency based on the $f_{max}$ behavior.

As further depicted in FIG. 2A, a local clock buffer (LCB) pulse generator 222 associated with microprocessor 201 distributes an on-chip microprocessor clock frequency fax that is received by inputs 228 and 230 of the first reconfigurable delay path circuit 202 and the second (optional) reconfigurable delay path 204 circuit, respectively. Also, output 232 of the control logic 210 is coupled to a digital phase locked loop (DPLL) 236, which generates and adjusts the on-chip microprocessor clock frequency $f_{CLK}$ based on the operation of the control circuit 200, as further described below. The on-chip microprocessor clock frequency $f_{CLK}$ is then input to the LCB pulse generator 222.

The first reconfigurable delay path circuit 202 emulates microprocessor system critical paths across a range (e.g., 1.0V-1.5V) of the microprocessor voltage supply (i.e., the turbo range). An exemplary embodiment corresponding to the first reconfigurable delay path circuit 202 is illustrated and described in relation to FIG. 2B. In operation, the first reconfigurable delay path circuit 202 emulates $f_{max}$ behavior in the turbo operating region and generate a time delayed clock pulse 240 for each received clock pulse 242 associated with the on-chip microprocessor clock frequency $f_{CLK}$ distributed by the LCB pulse generator 222. This time delayed clock pulse 240 is received and processed by the first 206 edge detector, which based on the magnitude of the delay, generates a multi-bit code also known as a thermometer code (e.g., 12-bit code: $D_0$-$D_{11}$). The multi-bit code (i.e., $D_0$-$D_{11}$) is then used as a frequency correction signal to control the frequency output of the DPLL 236 (i.e., clock source) and thus the on-chip microprocessor clock frequency $f_{CLK}$.

Similarly, the second reconfigurable delay path circuit 204 emulates microprocessor system critical paths across another range (e.g., 0.7V-1.0V) of the microprocessor voltage supply. In operation, the second reconfigurable delay path circuit 204 may emulate an SVT path and generate a time delayed clock pulse 244 for each received clock pulse 246 associated with the on-chip microprocessor clock frequency $f_{CLK}$ distributed by the LCB pulse generator 222. This time delayed clock pulse 244 is received and processed by the second 208 edge detector, which based on the magnitude of the delay, generates another multi-bit code known as a thermometer code (e.g., 12-bit code: $D'_0$-$D'_{11}$). The multi-bit code (i.e., $D'_0$-$D'_{11}$) is then used as a frequency correction signal to control the frequency output of the DPLL 236 (i.e., clock source) and thus the on-chip microprocessor clock frequency fax.

Figure 2B:
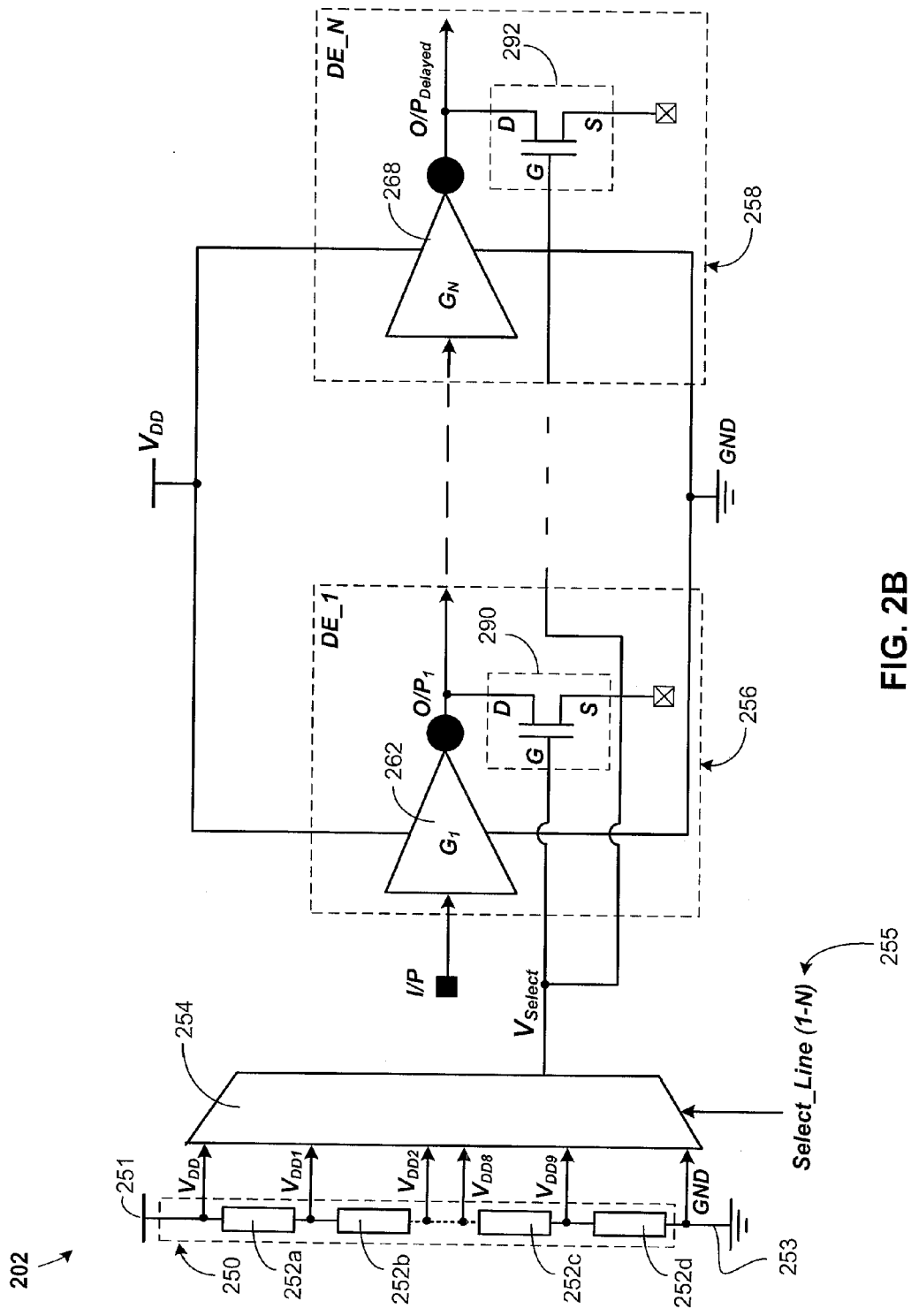
FIG. 2B is an exemplary embodiment of a critical path monitoring (CPM) circuit utilized within the control circuit embodiment depicted in FIG. 2A.

FIG. 2B is an exemplary embodiment of critical path monitoring (CPM) circuit 202 (i.e., a reconfigurable voltage desensitization circuit) utilized within the control circuit 200 embodiment depicted in FIG. 2A. The critical path monitoring (CPM) circuit 202 may include a voltage divider network 250, which includes a plurality of resistors 252a-252d that are connected in series between the digital supply $V_{DD}$, as indicated at 251, and ground GND, as indicated at 253. The voltage divider network 250 scales the voltage of the digital supply $V_{DD}$ to generate, for example, scaled supply voltages $V_{DD1}$, $V_{DD2}$, etc. For example, scaled supply voltage $V_{DD1}$ may include 90% of the digital supply $V_{DD}$, scaled supply voltage $V_{DD2}$ may include 80% of the digital supply $V_{DD}$, scaled supply voltage $V_{DD3}$ may include 70% of the digital supply $V_{DD}$, scaled supply voltage $V_{DD4}$ may include 60% of the digital supply $V_{DD}$, scaled supply voltage $V_{DD5}$ may include 50% of the digital supply $V_{DD}$, scaled supply voltage $V_{DD6}$ may include 40% of the digital supply $V_{DD}$, scaled supply voltage $V_{DD7}$ may include 30% of the digital supply $V_{DD}$, scaled supply voltage $V_{DD8}$ may include 20% of the digital supply $V_{DD}$, and scaled supply voltage $V_{DD9}$ may include 10% of the digital supply $V_{DD}$. The scaled supply voltages may generally include a range of voltage values anywhere between the supply voltage ($V_{DD}$) and 0V.

The critical path monitoring (CPM) circuit 202 also includes a selector device 254 such as a multiplexer that receives the ground (GND) voltage, the supply voltage ($V_{DD}$), and the scaled voltages ($V_{DD1}$-$V_{DD9}$) generated by voltage divider network 250. The selector device 254 includes a select control line 255 that enables the selection of the ground (GND) voltage, the supply voltage ($V_{DD}$), or any one of the desired scaled voltages ($V_{DD1}$-$V_{DD9}$). For example, if nine (9) scaled voltages ($V_{DD1}$-$V_{DD9}$), a ground (GND) voltage, and a supply voltage ($V_{DD}$) are provided by the voltage divider network 250, a 4-bit select line may be needed to controllably select any one of the eleven (11) selectable voltages. If the supply voltage ($V_{DD}$) is desired at the output ($V_{Select}$) of the selector device 254, the select line 255 may, for example, be set to "0000." If a scaled voltage corresponding to %90 of $V_{DD}$ is required at the output ($V_{Select}$) of the selector device 254, the select control line 255 may, for example, be set to "0001." If a scaled voltage corresponding to %80 of $V_{DD}$ is required at the output ($V_{Select}$) of the selector device 254, the select control line 255 may, for example, be set to "0010." If a scaled voltage corresponding to %70 of $V_{DD}$ is required at the output ($V_{Select}$) of the selector device 254, the select control line 255 may, for example, be set to "0011" etc.

The critical path monitoring (CPM) circuit 202 further includes one or more serially connected delay elements such as delay element 256 (DE_1) and delay element 258 (DE_N). Each delay element introduces a time delay to a pulse signal that propagates through it. For purposes of illustrative brevity, only the first delay element 256 and the last delay element 258 are depicted. However, between delay elements 256 and 258 any number of delay elements may be provided for emulating critical paths within the microprocessor. Each delay element may include an inverter logic gate delay stage (i.e., an inverter logic device) having a non-linear capacitive load such as an NFET transistor load. Thus, according to one exemplary embodiment, delay element 256 includes inverter logic gate delay stage 262 and NFET transistor 290. Similarly, delay element 258 includes inverter logic gate delay stage 268 and NFET transistor 292. In an alternative embodiment, one or more other logic devices providing a delay and having an output coupled to a non-linear capacitive load may be utilized. The voltage divider network 250 and the selector device 254 are one example of a voltage source for providing a bias voltage to the NFET transistors 290, 292.

As depicted, within delay element 256, the output $O/P_1$ of inverter 262 is electrically coupled to the drain (D) of NFET transistor 290, while the source (S) of NFET transistor 290 is either electrically floating or coupled to the drain (D) of NFET transistor 290. The gate (G) input of the NFET transistor 290 is electrically coupled to and driven by the output ($V_{Select}$) of selector device 254. Within delay element 256, the magnitude of time delay that is applied to an input pulse signal (i.e., microprocessor clock pulses $f_{CLK}$) received at the input (I/P) of the inverter 262 is governed by both the output resistance (R) of the inverter 262 and the gate-drain capacitance ($C_{dg}$) of the NFET transistor 290. The gate-drain capacitance ($C_{dg}$) of the NFET transistor 290 changes non-linearly as a function of the bias voltage that is applied to the gate (G) input of the NFET transistor 290. Therefore, by selectively determining the output ($V_{Select}$) of the selector device 254 via the select line 255, a different bias voltage value may be applied to the gate (G) input of the NFET transistor 290. This in turn provides a different rate of capacitance change as a function of changes to the bias voltage caused by the droop in supply voltage.

In particular, as depicted in FIG. 2B, the voltage divider network 250 is coupled to the supply voltage $V_{DD}$ at 251. Consequently, when the supply voltage $V_{DD}$ experiences a drop as a result of supply voltage droop, the resulting voltage reduction is also experienced at the output ($V_{Select}$) of the selector device 254 and thus the gate (G) input of the NFET transistor 290. The gate-drain capacitance ($C_{dg}$) of the NFET transistor 290 in turn changes depending on the bias voltage that is set at the gate (G) input of the NFET transistor 290.

Figure 3:
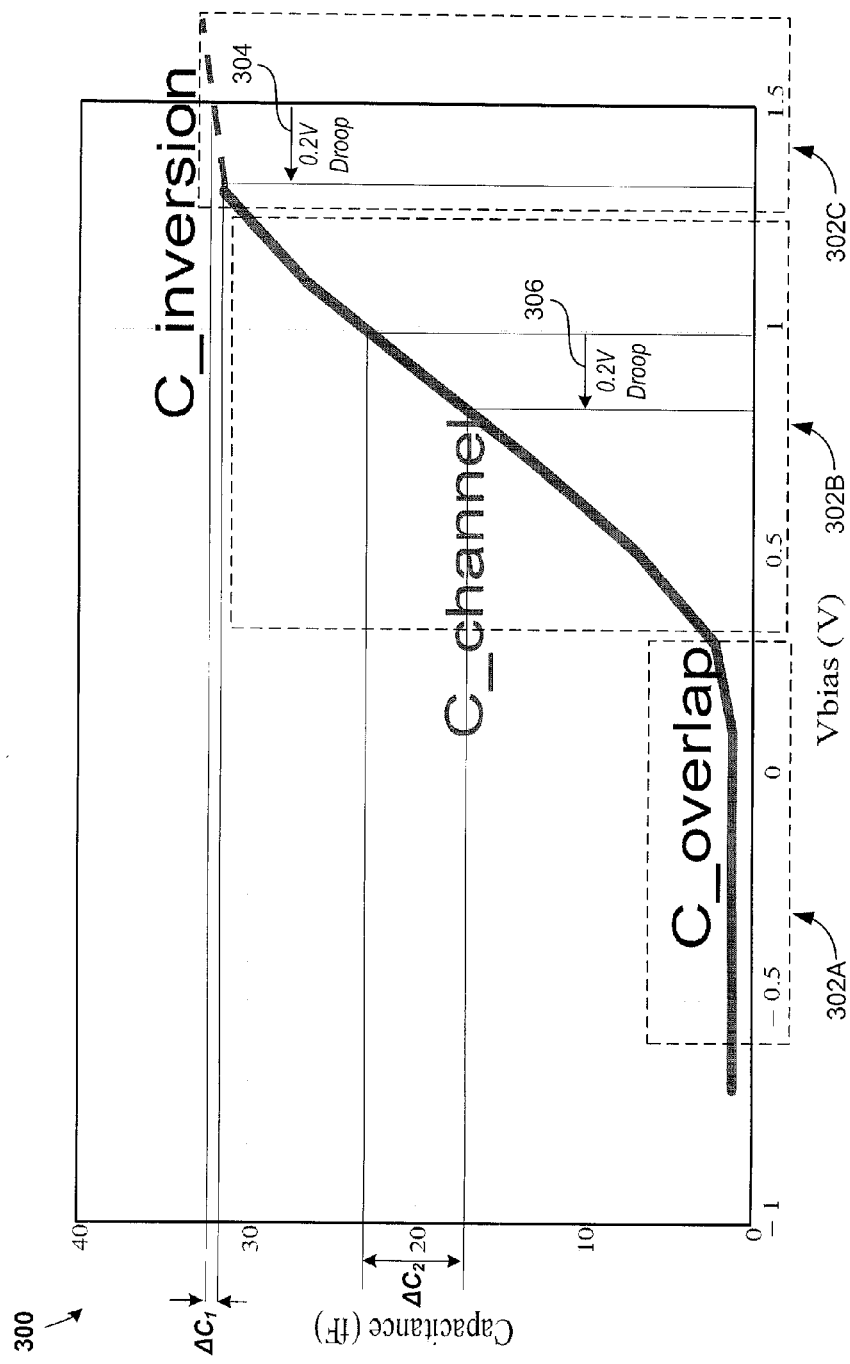
FIG. 3 shows graphs depicting the non-linear characteristics of the capacitive loads illustrated in the critical path monitoring (CPM) circuit embodiment of FIG. 2B.

For example, referring to FIG. 3, a graph 300 illustrating the gate-drain capacitance ($C_{dg}$) of the NFET transistor 290 (FIG. 2B) as a function of voltage bias is depicted. As shown by graph 300, the gate-drain capacitance ($C_{dg}$) of the NFET transistor 290 (FIG. 2B) is a non-linear function of its gate bias voltage. Accordingly, the different rates of capacitance change as a function of variations to the bias voltage are identified by regions 302A, 302B, and 302C. Region 302A refers to a deep-depleted overlap capacitance, region 302B refers to a channel capacitance, and region 302C refers to an inversion capacitance.

Referring to FIG. 2B, for example, the gate (G) input of the NFET transistor 290 may be biased at 1.5V (i.e., scaled supply voltage $V_{DD1}$) by setting the select line 255 to "0001" and generating a selector device 254 output ($V_{Select}$) of 1.5V. Based on the occurrence of a supply voltage droop on $V_{DD}$, the selector device 254 output ($V_{Select}$) of 1.5V applied to the gate (G) input of the NFET transistor 290 may drop by 0.2V to 1.3V. As depicted at 304 in FIG. 3, a bias voltage change from 1.5V to 1.3V generates a relatively small reduction in capacitance $\Delta C_1$ in the gate-drain capacitance ($C_{dg}$) of the NFET transistor 290. However, the supply voltage $V_{DD}$ droop generates a set delay (i.e., increased slowdown) in the inverter 262 as a result of the inverter's 262 output resistance ($\Delta R$) increasing. Thus, the delay change generated by the delay element 256 is facilitated by both the change (i.e., reduction) in capacitance $\Delta C_1$ and the output resistance change ($\Delta R$). Here, within delay element 256, the small change in capacitance has a relatively small effect compared to the inverter's 262 increased output resistance ($\Delta R$) and corresponding increased delay given by $\Delta C_1 \times \Delta R$.

Still referring to FIG. 2B, for example, the gate (G) input of the NFET transistor 290 may alternatively be biased at 1.0V (i.e., scaled supply voltage $V_{DD4}$) by setting the select line 254 to "0100" and generating a selector device 254 output ($V_{Select}$) of 1.0V. Based on the occurrence of a supply voltage droop on $V_{DD}$, the selector device 254 output ($V_{Select}$) of 1.0V applied to the gate (G) input of the NFET transistor 290 may drop by 0.2V to 0.8V. As depicted at 306 in FIG. 3, a bias voltage change from 1.0V to 0.8V generates a relatively larger reduction in capacitance $\Delta C_2$ in the gate-drain capacitance ($C_{dg}$) of the NFET transistor 290. However, the supply voltage $V_{DD}$ droop also generates an increased delay (i.e., increased slowdown) in the inverter 262 as a result of the inverter's 262 output resistance ($\Delta R$) increasing. The delay change generated by the delay element 256 is accordingly facilitated by both the change (i.e., reduction) in capacitance $\Delta C_2$ and the output resistance change ($\Delta R$). Here, within delay element 256, the larger reduction in capacitance has a relatively increased effect on the inverter's 262 change in output resistance ($\Delta R$), and thus, in generating the delay given by $\Delta C_2 \times \Delta R$.

In particular, during the voltage droop scenario, it can be observed that by biasing the gate (G) input of the NFET transistor 290 in region 302C (FIG. 3), the NFET transistor 290, acting as a non-linear capacitive load of the inverter 262, has a relative small effect on the delay increase dominated the inverter's 262 change in output resistance ($\Delta R$). During the voltage droop scenario, it can alternatively be observed that by biasing the gate (G) input of the NFET transistor 290 in region 302B (FIG. 3), the NFET transistor 290 acting as a non-linear capacitive load of the inverter 262 has a relatively large effect on the delay increase exhibited by the inverter's 262 change in output resistance ($\Delta R$). In region 302B (FIG. 3), the increased slope depicting the capacitance versus bias voltage reacts to the voltage droop by causing a more significant reduction ($\Delta C_2$) in capacitance. This capacitance reduction in turn may substantially counteract the increased change in output resistance ($\Delta R$). The net result can therefore be little to no increased delay generated by the delay element 256 during the occurrence of voltage droop on $V_{DD}$. In this operating mode, the CPM circuit 202 is configured to be desensitized to changes in supply voltage $V_{DD}$ droop by generating little to no delay change via its delay elements DE_1 to DE_N. This CPM circuit 202 configuration may be necessary when operating the microprocessor in the turbo region having higher supply voltages.

The above-description of delay element 256 (DE_1) substantially applies to all the delay elements of circuit 202. In particular, within delay element 258, the output O/P$_{Delayed}$ of inverter 268 is electrically coupled to the drain (D) of NFET transistor 292, while the source (S) of NFET transistor 292 is either electrically floating or coupled to the drain (D) of NFET transistor 292. The gate (G) input of the NFET transistor 292 is electrically coupled to and driven by the output (V$_{Select}$) of selector device 254. Within delay element 258, the magnitude of time delay that is applied to a signal (i.e., microprocessor clock pulses f$_{CLK}$) received at the input (I/P) of the inverter 268 is governed by both the output resistance (R) of the inverter and the gate-drain capacitance (C$_{dg}$) of the NFET transistor 292. The gate-drain capacitance (C$_{dg}$) of the NFET transistor 292 changes non-linearly as a function of the bias voltage that is applied to the gate (G) input of the NFET transistor 292. Therefore, by selectively determining the output (V$_{Select}$) of the selector device 254 via the select line 255, a different bias voltage value may be applied to the gate (G) input of the NFET transistor 292. This in turn provides a different rate of capacitance change as a function of changes to the bias voltage cause by the droop in supply voltage.

In particular, as depicted in FIG. 2B, the voltage divider network 250 is coupled to the supply voltage V$_{DD}$ at 251. Consequently, when the supply voltage V$_{DD}$ experiences a drop as a result of supply voltage droop, the resulting voltage reduction is also experienced at the output (V$_{Select}$) of the selector device 254. The gate-drain capacitance (C$_{dg}$) of the NFET transistor 292 in turn changes depending on the bias voltage that is set at the gate (G) input of the NFET transistor 292.

For example, referring to FIG. 3, as shown by graph 300, the gate-drain capacitance (C$_{dg}$) of the NFET transistor 292 (FIG. 2B) is a non-linear function of its gate bias voltage. Accordingly, as previously described, the different rates of capacitance change as a function of changes to the bias voltage may be identified by regions 302A, 302B, and 302C. Region 302A refers to a deep-depleted overlap capacitance, region 302B refers to a channel capacitance, and region 302C refers to an inversion capacitance.

Referring to FIG. 2B, for example, the gate (G) input of the NFET transistor 292 may be biased at 1.5V (i.e., scaled supply voltage V$_{DD1}$) by setting the select line 254 to "0001" and generating a selector device 254 output (V$_{Select}$) of 1.5V. Based on the occurrence of a supply voltage V$_{DD}$ droop, the selector device 254 output (V$_{Select}$) of 1.5V applied to the gate (G) input of the NFET transistor 290 may drop by 0.2V to 1.3V. As depicted at 304 in FIG. 3, a bias voltage change from 1.5V to 1.3V generates a relatively small reduction in capacitance ΔC$_1$ in the gate-drain capacitance (C$_{dg}$) of the NFET transistor 292. However, the droop in supply voltage V$_{DD}$ generates an increased delay (i.e., increased slowdown) in the inverter 268 as a result of the inverter's 268 output resistance (ΔR) increasing. Thus, the delay change generated by the delay element 258 is facilitated by both the change (i.e., reduction) in capacitance ΔC$_1$ and the output resistance change (ΔR). Here, within delay element 258, the small change in capacitance has a relatively small effect compared to the inverter's 268 increased output resistance (ΔR) and corresponding increased delay given by ΔC$_1$×ΔR.

Still referring to FIG. 2B, for example, the gate (G) input of the NFET transistor 292 may alternatively be biased at 1.0V (i.e., scaled supply voltage V$_{DD4}$) by setting the select line 254 to "0100" and generating a selector device 254 output (V$_{Select}$) of 1.0V. Based on the occurrence of a supply voltage V$_{DD}$ droop, the selector device 254 output (V$_{Select}$) of 1.0V applied to the gate (G) input of the NFET transistor 292 may drop by 0.2V to 0.8V. As depicted at 306 in FIG. 3, a bias voltage change from 1.0V to 0.8V generates a relatively larger reduction in capacitance ΔC$_2$ in the gate-drain capacitance (C$_{dg}$) of the NFET transistor 292. However, the supply voltage V$_{DD}$ droop still generates an increased delay (i.e., increased slowdown) in the inverter 268 as a result of the inverter's 268 output resistance (ΔR) increasing due to the droop condition to the power supply V$_{DD}$. The delay change generated by the delay element 258 is accordingly facilitated by both the change (i.e., reduction) in capacitance ΔC$_2$ and the output resistance change (ΔR). Here, within delay element 258, the larger reduction in capacitance has a relatively increased effect on the inverter's 268 change in output resistance (ΔR), and thus, in generating the delay given by ΔC$_2$×ΔR.

In particular, during the voltage droop scenario, it can be observed that by biasing the gate (G) input of the NFET transistor 292 in region 302C (FIG. 3), the NFET transistor 292, acting as a non-linear capacitive load of the inverter 268, has a relative small effect on the delay increase dominated the inverter's 268 change in output resistance (ΔR). During the voltage droop scenario, it can alternatively be observed that by biasing the gate (G) input of the NFET transistor 292 in region 302B (FIG. 3), the NFET transistor 292 acting as a non-linear capacitive load of the inverter 268 has a relatively large effect on the delay increase exhibited by the inverter's 268 change in output resistance (ΔR). In region 302B (FIG. 3), the increased slope depicting the capacitance versus bias voltage, reacts to the voltage droop by causing a more significant reduction (ΔC$_2$) in capacitance. This capacitance reduction in turn may substantially counteract the increased change in output resistance (ΔR). The net result can therefore be little to no increased delay generated by the delay element 258. In this operating mode, as previously described, the CPM circuit 202 is thus configured to be desensitized to changes in supply voltage V$_{DD}$ droop by generating little to no delay change via its delay elements DE_1 to DE_N.

Figure 4:
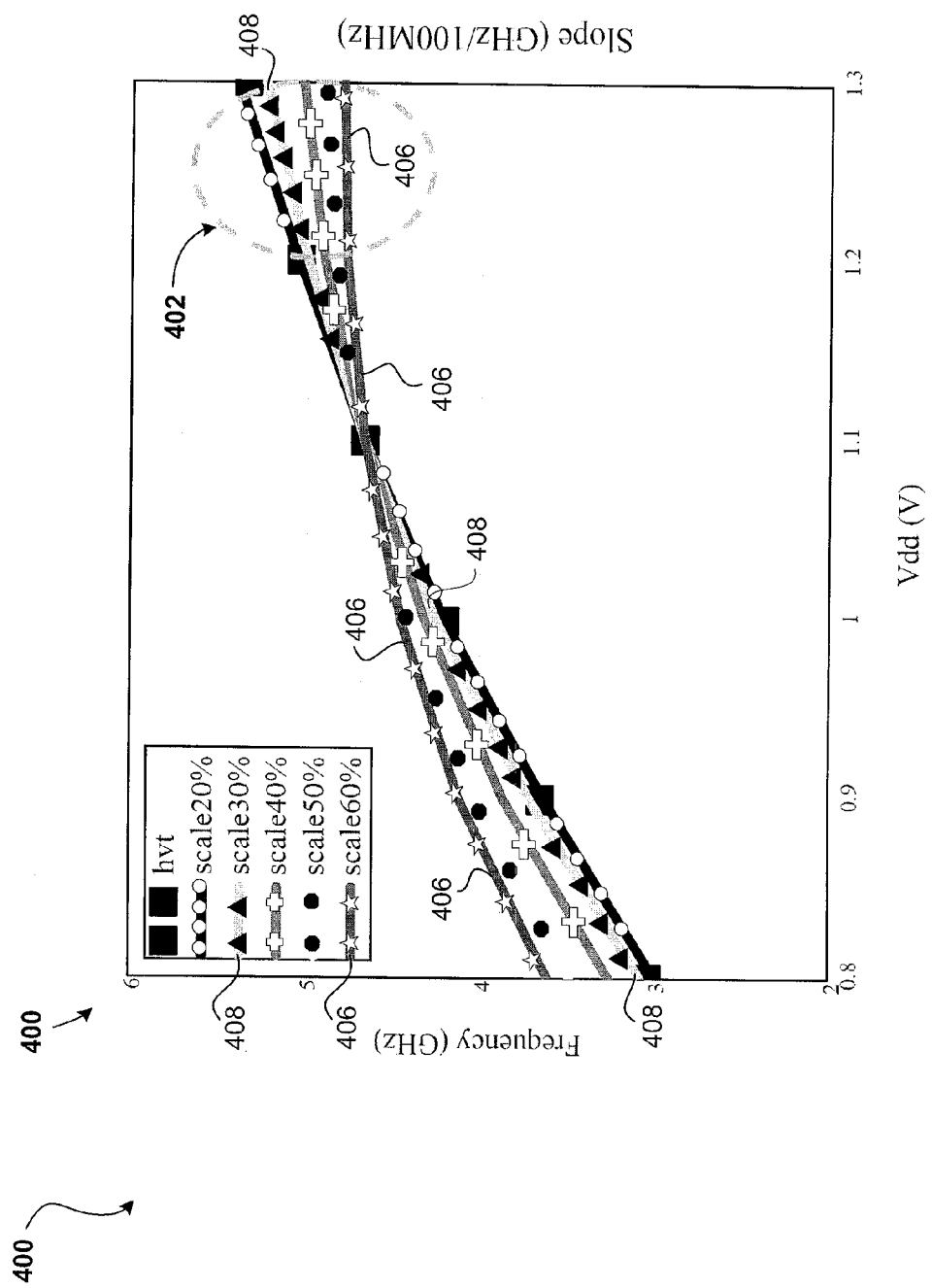
FIG. 4 is a graph showing exemplary frequency tracking slope characteristics for the CPM circuit of FIG. 2B.

FIG. 4 is a graph 400 showing exemplary frequency tracking slope characteristics for the CPM circuit of FIG. 2B. Since different critical circuit paths within the microprocessor may require different tracking slopes, CPM circuit 202 (FIG. 2B) provides different configurable tracking slopes as a function of different bias voltages that are applied to the gate input (G) of the delay element DE_1-DE_N transistors. For example, within the turbo operating region depicted by 402, the tracking slope of the CPM circuit 202 (FIG. 2B) may be varied by selecting the bias voltage of the delay element DE_1-DE_N transistors via the selector device 254 (FIG. 2B) and selector control line 255 (FIG. 2B).

In some exemplary implementations, the supply voltage V$_{DD}$ may be scaled (e.g., down from V$_{DD}$ by 60%) to generate response curve 406. As illustrated, if the CPM circuit 202 (FIG. 2B) is configured to operate based on response curve 406, as described above, the CPM circuit 202 is configured to be desensitized to changes in supply voltage V$_{DD}$ droop by generating little to no delay change via its delay elements DE_1 to DE_N. Based on the above description, the 60% scaling of V$_{DD}$ may bias the delay element DE_1-DE_N transistors (i.e., 290 . . . 292) at 1V, whereby a voltage droop (e.g., 0.2V) causes little to no delay change associated with the delay elements DE_1-DE_N and consequently a substantially unchanged delayed output (O/P$_{Delayed}$) at the last delay element 258 (DE_N).

In other exemplary implementations, the supply voltage V$_{DD}$ may be scaled (e.g., down from V$_{DD}$ by 30%) to generate response curve 408. As illustrated, if the CPM circuit 202 (FIG. 2B) is configured to operate based on response curve 408, as described above, the CPM circuit 202 is configured to be sensitive to changes in supply voltage V$_{DD}$ droop by generating a net delay change via its delay elements DE_1 to DE_N. Based on the above description, the 30% scaling of V$_{DD}$ may bias the delay element DE_1-DE_N transistors (i.e., 290 . . . 292) at 1.5V, whereby a voltage droop causes a delay change in the delay elements DE_1-DE_N and consequently an increased delayed output (O/P$_{Delayed}$) at the last delay element 258 (DE_N).

Still referring to FIG. 2B, during normal operation where no voltage droop is experienced, the delay path resulting from delay elements DE_1 to DE_N of the CPM circuit 202 introduces a known predetermined delay. More specifically, output V$_{select}$ is coupled to, and biases, the gate input (G) of NFET transistor 290, NFET transistor 292, and any other NFET gate inputs therebetween. Each of these transistors provides a capacitive load (C$_L$) at the output of their respective inverter devices (G$_1$ . . . G$_N$). Thus, within each delay element (DE_1-DE_N), the output resistance (R) of each inverter and the capacitive load (C$_L$) of each transistor coupled to its corresponding inverter causes a delay substantially given by R×C$_L$. For example, the output resistance (R) of inverter 262 and the capacitive load (C$_L$) of transistor NFET 290 that is coupled to the output of inverter 262 substantially sets the delay that is provided by delay element DE_1.

In a first example operating scenario, the microprocessor clock signal is received at the input I/P of delay element 256 (i.e., DE_1). In particular, the microprocessor clock signal is received at the input I/P of inverter 262. As the microprocessor clock signal propagates through each delay element DE_1-DE_N, it experiences a delay at each delay element that is substantially given by Rx C$_L$. For example, as described above, the gate (G) input of NFET transistor 290, NFET transistor 292, and any NFET transistors located therebetween, may be biased at 1.5V (i.e., scaled supply voltage V$_{DD1}$) by setting the select line 255 to "0001" and generating a selector device 254 output (V$_{Select}$) of 1.5V. Referring to graph 300 (FIG. 3), by biasing the transistors at 1.5V, each transistor within a delay element may exhibit a load capacitance of about 33 fF, which in combination with its corresponding inverter output resistance, provides a delay to the microprocessor clock signal propagating through each delay element DE_1-DE_N.

Within the first operating scenario (i.e., sensitized mode) and during a supply voltage droop condition, the delay path resulting from delay elements DE_1 to DE_N of the CPM circuit 202 introduces an additional delay to that of the known predetermined delay. Since output V$_{Select}$ is coupled to, and biases, the gate input (G) of NFET transistor 290, NFET transistor 292, and any other NFET gate input therebetween, the gate (G) biases also undergo a reduction in bias voltage. During the voltage droop, each of the transistors experience a capacitive load (C$_L$) reduction (ΔC$_L$), while the respective inverter devices (G$_1$ . . . G$_N$) coupled to these transistors exhibit an increase in output resistance (R). Thus, within each delay element (DE_1-DE_N), the increased output resistance (ΔR) of each inverter and the reduction in capacitive load (ΔC$_L$) of each transistor coupled to its corresponding inverter may cause a net increased delay substantially given by ΔR×ΔC$_L$. For example, the output resistance change (ΔR) of inverter 262 and the capacitive load change (ΔC$_L$) of NFET transistor 290 that is coupled to the output of inverter 262 substantially increases the delay that is provided by delay element DE_1 during the droop condition.

During the voltage droop in the first operating scenario, the microprocessor clock signal is received at the input I/P of delay element 256 (i.e., DE_1). In particular, the microprocessor clock signal, as indicated at I/P, is received at the input of inverter 262. As the microprocessor clock signal propagates through each delay element DE_1-DE_N, it experiences an additional delay at each delay element that is substantially given by ΔR×ΔC$_L$. For example, as described above, the gate (G) input of NFET transistor 290, NFET transistor 292, and any NFET transistors located therebetween, may be biased at 1.5V (i.e., scaled supply voltage V$_{DD1}$) by setting the select line 255 to "0001" and generating a selector device 254 output (V$_{Select}$) of 1.5V. During the voltage droop, the selector device 254 output (V$_{Select}$) of may drop from 1.5V to 1.3V. Referring to graph 300 (FIG. 3), the drop in the transistor's bias voltage from 1.5V to 1.3V causes each transistor within a delay element to exhibit a load capacitance reduction from about 33 fF to about 31.5 fF, while each corresponding inverter's output resistance (R) increases (ΔR). This in turn generates an increased delay to the microprocessor clock signal propagating through each delay element DE_1-DE_N. Here, within each delay element, the net delay increases due to the resistance increase (ΔR) dominating relative to the reduction in load capacitance (ΔC$_L$).

In a second example operating scenario, the microprocessor clock signal is received at the input I/P of delay element 256 (i.e., DE_1). Thus, the microprocessor clock signal, as indicated at I/P, is received at the input of inverter 262. As the microprocessor clock signal propagates through each delay element DE_1-DE_N, it experiences a delay at each delay element that is substantially given by R×C$_L$. For example, as described above, the gate (G) input of NFET transistor 290, NFET transistor 292, and any NFET transistors located therebetween, may be biased at 1.0V (i.e., scaled supply voltage V$_{DD4}$) by setting the select line 255 to "0100" and generating a selector device 254 output (V$_{Select}$) of 1.0V. Referring to graph 300 (FIG. 3), by biasing the transistors at 1.0V, each transistor within a delay element may exhibit a load capacitance of about 23 fF, which in combination with its corresponding inverter output resistance, provides a delay to the microprocessor clock signal propagating through each delay element DE_1-DE_N.

Within the second operating scenario (i.e., desensitized mode) and during a supply voltage droop condition, the delay path resulting from delay elements DE_1 to DE_N of the CPM circuit 202 undergoes substantially little to no delay to that of the known predetermined delay. Since output V$_{Select}$ is coupled to, and biases, the gate input (G) of NFET transistor 290, NFET transistor 292, and any other NFET gate input therebetween, the gate (G) biases also undergo a reduction in bias voltage. During the voltage droop, each of the transistors experience a capacitive load (C$_L$) reduction (ΔC$_L$), while the respective inverter devices (G$_1$ . . . G$_N$) coupled to these transistors exhibit an increase in output resistance (R). Thus, within each delay element (DE_1-DE_N), the increased output resistance (ΔR) of each inverter and the reduction in capacitive load (ΔC$_L$) of each transistor coupled to its corresponding inverter may cause no net increased delay based on the reduction in load capacitance (ΔC$_L$) substantially counteracting the increase in output resistance (R). For example, the output resistance change ($\Delta R$) of inverter 262 and the capacitive load change ($\Delta C_L$) of NFET transistor 290 that is coupled to the output of inverter 262 substantially cancel each other out causing no additional delay by delay element DE_1 during the droop condition.

During the voltage droop in the second operating scenario, the microprocessor clock signal is received at the input I/P of delay element 256 (i.e., DE_1). In particular, the microprocessor clock signal, as indicated at I/P, is received at the input of inverter 262. As the microprocessor clock signal propagates through each delay element DE_1-DE_N, it experiences no additional delay at each delay element that is substantially given by $\Delta R \times \Delta C_L$. During this desensitized operating mode within the turbo operating region, within each delay element DE_1-DE_N, the reduction in load capacitance $\Delta C_L$ substantially cancels out the increased output resistance ($\Delta R$). For example, as described above, the gate (G) input of NFET transistor 290, NFET transistor 292, and any NFET transistors located therebetween, may be biased at 1.0V (i.e., scaled supply voltage $V_{DD4}$) by setting the select line 255 to "0100" and generating a selector device 254 output ($V_{Select}$) of 1.0V. During the voltage droop, the selector device 254 output ($V_{Select}$) may drop from 1.0V to 0.8V. Referring to graph 300 (FIG. 3), the drop in the transistor's bias voltage from 1.0V to 0.8V causes each transistor within a delay element to exhibit a load capacitance reduction from about 23 fF to about 17.5 fF, while each corresponding inverter's output resistance (R) increases ($\Delta R$). In contrast to the first exemplary operating scenario, no increased delay to the microprocessor clock signal propagating through each delay element DE_1-DE_N is generated. Here, within each delay element, the net delay remains substantially unchanged due to the increased reduction in load capacitance ($\Delta C_L$) counteracting or canceling the increased resistance ($\Delta R$) occurring during the voltage droop. This in turn leads to an appropriate response when the CPM circuit 202 is operating in the turbo region and a flat response is desired, whereby the $f_{max}$ frequency does not change with voltage droop.

For example, referring to FIG. 1A, within the turbo region, as the microprocessor supply voltage droops from V3 to V4, little to no change in $f_{max}$ occurs. Based on the appropriate biasing of each transistor within a delay element, the CPM circuit 202 operating in the turbo region responds by generating little to no delay. Since, within the turbo region, a substantially flat response may be desired, the little to no generated delay maintains the frequency of the microprocessor's clock without a need for re-adjustment. An inappropriate adjustment and reduction of the operating frequency of the microprocessor clock by a CPM may be detrimental to the microprocessors performance. The CPM circuit 202 operating in the turbo region may thus avoid such a scenario by adjusting the bias voltage to the NFET transistors 290, 292 acting as a non-linear capacitive load.

As described above in relation to FIG. 1A, when voltage droop occurs, depending on whether the operating scenario warrants a desensitized or sensitized mode, the microprocessor clock frequency should also be backed-off to maintain the frequency guardband. Thus, any additional time delay generated by the delay element DE_1-DE_N is utilized by the edge detector circuits 206, 208 (FIG. 2A) to generate the multi-bit codes and reduce the microprocessor clock frequency (i.e., operating frequency) via LCB pulse generator 222 (FIG. 2A).

Figure 2C:
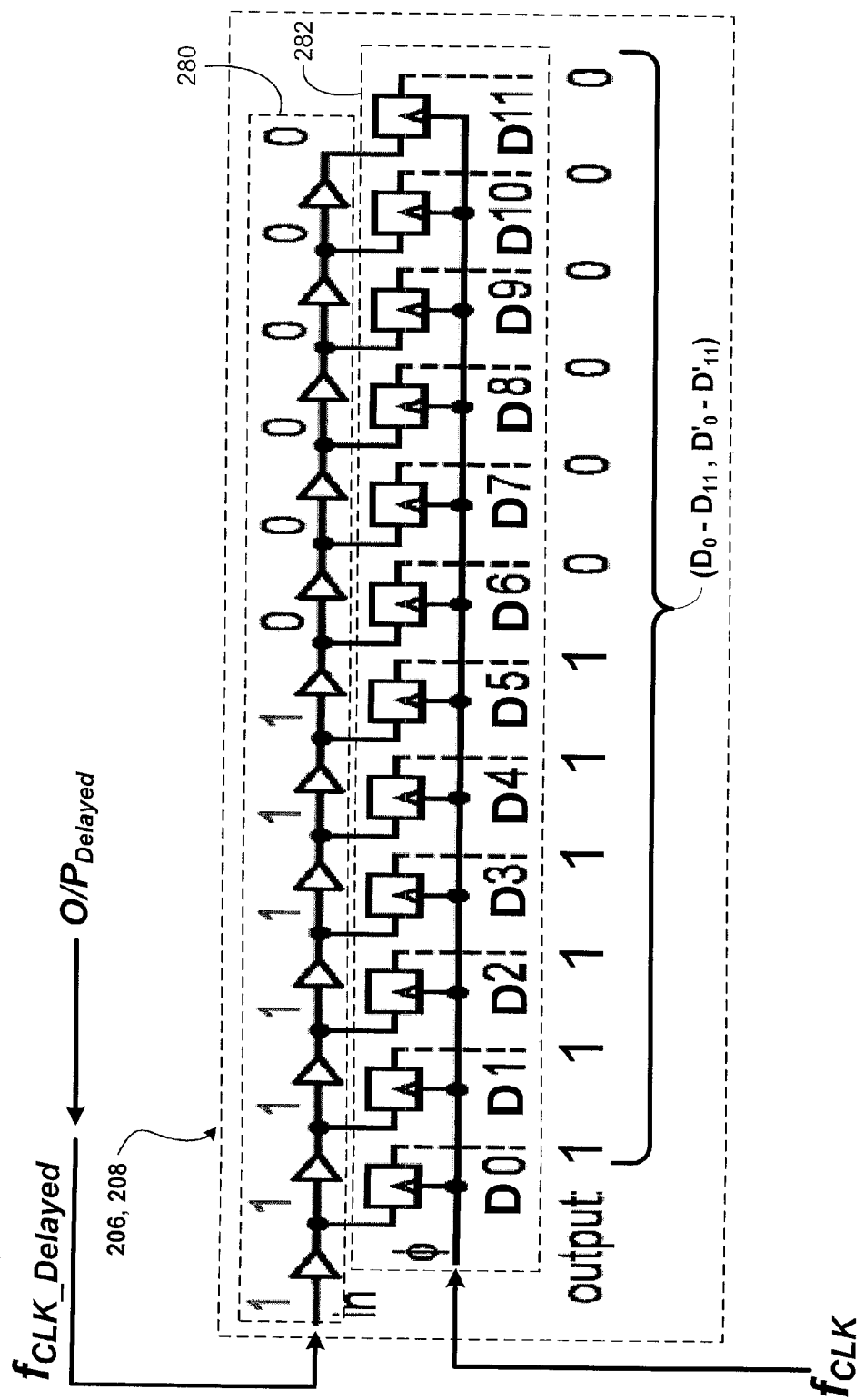
FIG. 2C is an exemplary embodiment of an edge detector circuit utilized within the control circuit embodiment depicted in FIG. 2A.

FIG. 2C is an exemplary embodiment of an edge detector circuit 206, 208 utilized within the control circuit embodiment depicted in FIG. 2A. Each edge detector circuit 206, 208 may include a bank of delay gates 280 and a bank of flip-flops 282 coupled to the bank of delay gates 280. As depicted, the output of each delay gate corresponding to the bank of delay gates 280 is coupled to the input of each corresponding flip-flip associated with the bank of flip-flops 282. The output of the bank of flip-flops 282 provides the multi-bit code (D0-D11) that may be used to control the DPLL 236 (FIG. 2A) frequency.

Each delayed pulse of the microprocessor clock frequency, as indicated by $f_{CLK\_Delayed}$, from output $O/P_{Delayed}$ (also see FIG. 2B) is received by the bank of delay gates 280 as an input. Also, the non-delayed version of the microprocessor clock pulses, as indicated by fax, are received as a clock input to the bank of flip-flops 282. In operation, based on the time delay difference between each non-delayed microprocessor clock pulse $f_{CLK}$ and each delayed pulse $f_{CLK\_Delayed}$ received from output O/P Delayed (also see FIG. 2B) of one of the CPM circuits 202, 204, a corresponding number of 'logic 1' values are generated at some of the outputs of the bank of delay gates 280.

For example, during normal operation whereby no voltage droop is experienced, the delay path resulting from delay elements DE_1 to DE_N (FIG. 2B) of the CPM circuit 202 (FIG. 2B) introduces a known predetermined delay compared to fax. This known predetermined delay may cause each delayed pulse $f_{CLK\_Delayed}$ from $O/P_{Delayed}$ to propagate along the bank of delay gates 280 during each pulse period of $f_{CLK}$. For example, based on the known predetermined delay, each delayed pulse $f_{CLK\_Delayed}$ at $O/P_{Delayed}$ may propagate along six gates within the bank of delay gates 280, and thus, generate a D0-D11 multi-bit code of "111111000000." This multi-bit code of "111111000000" when applied to the DPLL 236 (FIG. 2A) may generate a nominal clock frequency (e.g., 4.5 GHz).

However, during voltage droop, an additional delay may be generated and experienced by each delayed pulse at $O/P_{delayed}$. Consequently, each delayed pulse $f_{CLK\_Delayed}$ at $O/P_{Delayed}$ may propagate less along the bank of delay gates 280 during each pulse period of $f_{CLK}$. Thus, a D0-D11 multi-bit code of "111110000000" may be generated. This multi-bit code of "111111000000" when applied to the DPLL 236 (FIG. 2A) may generate a clock frequency (e.g., 4.35 GHz) that is less than the nominal clock frequency (e.g., 4.5 GHz) in response to the voltage droop. Conversely, when the supply voltage recovers from this voltage droop, the additional delay generated and experienced by each delayed pulse $f_{CLK\_Delayed}$ at $O/P_{Delayed}$ is also alleviated. Thus, each delayed pulse $f_{CLK\_Delayed}$ at $O/P_{Delayed}$ may once again propagate further along the bank of delay gates 280 during each pulse period of fax. Thus, the D0-D11 multi-bit code is restored back to "111111000000," which in turn increases the clock frequency back to the nominal clock frequency (e.g., 4.5 GHz) value.

Based on circuit 202 (FIG. 2B) operating in the desensitized mode, the delay elements DE_1 to DE_N (FIG. 2B) will not generate additional delay upon the occurrence of a voltage droop condition. Therefore, the D0-D11 multi-bit code will not change and result in a clock frequency adjustment. Conversely, based on circuit 202 (FIG. 2B) operating in the sensitized mode, the delay elements DE_1 to DE_N (FIG. 2B) will generate additional delay upon the occurrence of a voltage droop condition. Therefore, the D0-D11 multi-bit code will change and result in a clock frequency adjustment to establish a guardband.

Figure 5:
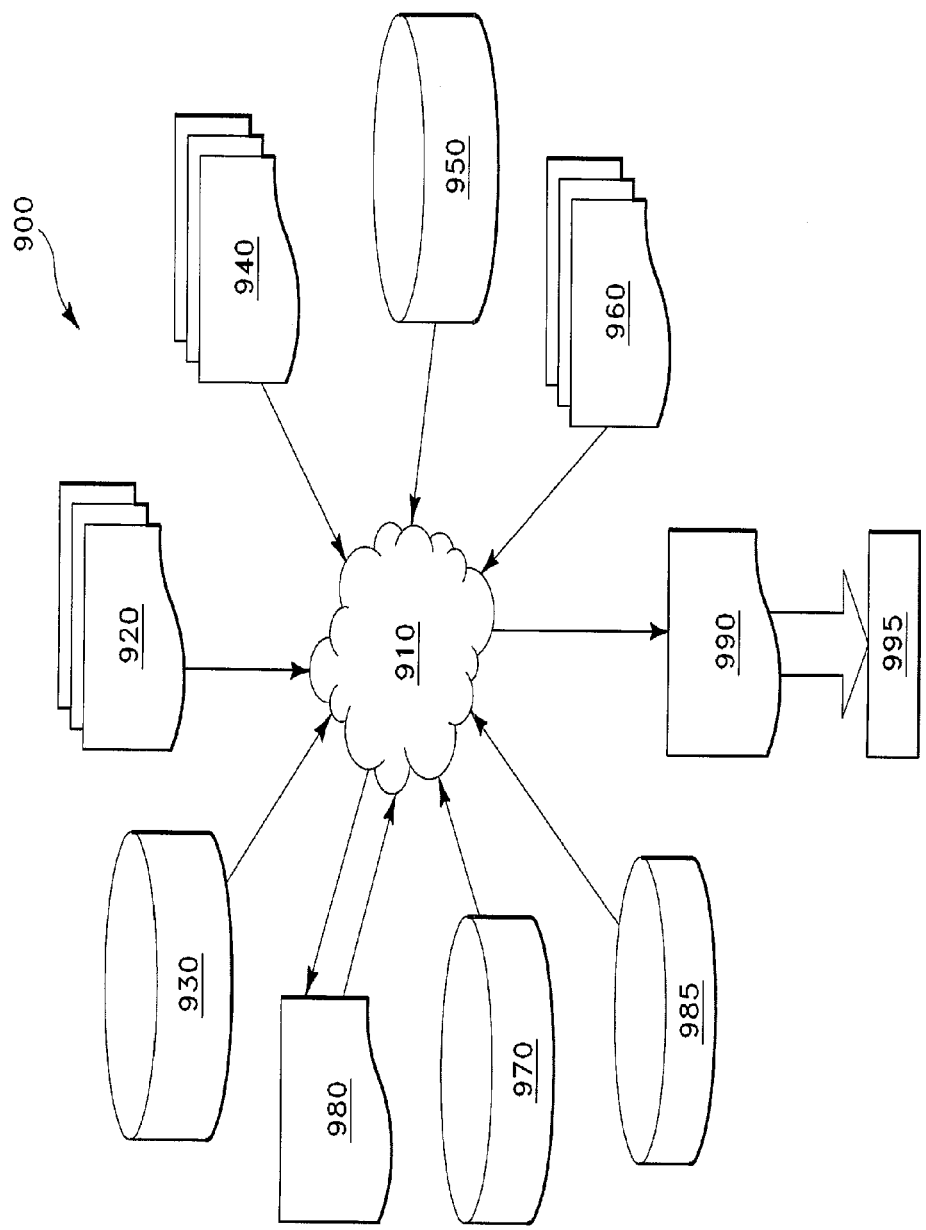
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2A-2C. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2A-2C. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2A-2C to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A-2C. In one embodiment, design structure 990 may comprise a compiled, executable HDL simulation model that functionally simulates the devices shown in FIGS. 2A-2C.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2A-2C. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A circuit for controlling a clock signal having an operating frequency that is generated by a clock source associated with a microprocessor device, the circuit comprising:
    a voltage source that provides a bias voltage;
    at least one delay element having a non-linear capacitive load coupled to an output of the at least one delay element, the non-linear capacitive load receiving the bias voltage from the voltage source and controlling a delay magnitude applied to a plurality of pulses corresponding to the clock signal by the at least one delay element; and
    an edge detector circuit that receives both an undelayed version of the plurality of pulses corresponding to the clock signal and the plurality of pulses of the clock signal having the delay magnitude applied by the at least one delay element, wherein the edge detector circuit generates a multi-bit code based on the delay magnitude of the plurality of pulses of the clock signal relative to the undelayed version of the plurality of pulses corresponding to the clock signal,
    wherein, based on the bias voltage having a first scaled voltage, the delay magnitude that is applied to the plurality of pulses of the clock signal is increased in order to generate a frequency correction to the operating frequency based on a variation to a supply voltage of the microprocessor, and
    wherein, based on the bias voltage having a second scaled voltage, the delay magnitude that is applied to the plurality of pulses of the clock signal is maintained in order to retain the operating frequency of the clock signal during the variation to the supply voltage of the microprocessor.

2. The circuit of claim 1, wherein the non-linear capacitive load comprises an NFET transistor having a gate that is coupled to the voltage source, a drain that is coupled to the output of the at least one delay element, and a source that is electrically floating.

3. The circuit of claim 2, wherein the voltage source comprises:
    a voltage divider network that provides a plurality of voltages; and
    a selector device that receives the plurality of voltages and provides the bias voltage, wherein the bias voltage is scalable between the supply voltage and a ground reference, and wherein based on the bias voltage being scalable the delay magnitude sensitivity varies.

4. The circuit of claim 3, wherein the voltage divider network comprises a plurality of resistors connected between the supply voltage of the microprocessor and the ground reference.

5. The circuit of claim 3, wherein the selector device comprises a selector input that selects the bias voltage from among the received plurality of voltages, the bias voltage providing a decreased frequency per supply voltage variation slope as a function of an increased scaling of the bias voltage, and the bias voltage providing an increased frequency per supply voltage variation slope as a function of a decreased scaling of the bias voltage.

6. The circuit of claim 1, wherein the bias voltage comprises a voltage value in a range of from about the supply voltage down to about zero volts.

7. The circuit of claim 1, wherein the at least one delay element comprises an inverter logic device having an output that is coupled to the non-linear capacitive load.

8. The circuit of claim 7, wherein the delay magnitude is based on an output resistance corresponding to the inverter and a capacitance value corresponding to the non-linear capacitive load.

9. The circuit of claim 1, further comprising:
    a digital phase locked loop that receives the multi-bit code from the edge detector circuit and generates the frequency correction to the operating frequency of the clock source in the microprocessor device.

\* \* \* \* \*